(12) United States Patent
Wong et al.

(10) Patent No.: US 10,879,219 B2
(45) Date of Patent: Dec. 29, 2020

(54) LOWER IC PACKAGE STRUCTURE FOR COUPLING WITH AN UPPER IC PACKAGE TO FORM A PACKAGE-ON-PACKAGE (POP) ASSEMBLY AND POP ASSEMBLY INCLUDING SUCH A LOWER IC PACKAGE STRUCTURE

(71) Applicant: Intel Corporation, Santa Clara, CA (US)

(72) Inventors: Shaw Fong Wong, Penang (MY); Wei Keat Loh, Bayan Lepas (MY); Kang Eu Ong, Penang (MY); Au Seong Wong, Kulim (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/861,421

(22) Filed: Jan. 3, 2018

(65) Prior Publication Data

US 2018/0374833 A1 Dec. 27, 2018

Related U.S. Application Data

(63) Continuation of application No. 12/970,114, filed on Dec. 16, 2010, now abandoned.

(51) Int. Cl.
*H01L 25/10* (2006.01)
*H01L 25/065* (2006.01)
(Continued)

(52) U.S. Cl.
CPC ............ *H01L 25/105* (2013.01); *H01L 23/13* (2013.01); *H01L 23/49833* (2013.01);
(Continued)

(58) Field of Classification Search
CPC ....................................................... H01L 25/10
See application file for complete search history.

(56) References Cited

U.S. PATENT DOCUMENTS

| 6,759,307 B1 | 7/2004 | Yang |
| 2003/0052419 A1 | 3/2003 | Ujiie et al. |

(Continued)

FOREIGN PATENT DOCUMENTS

| CN | 103270587 A | 8/2013 |
| CN | 103270587 B | 3/2017 |

(Continued)

OTHER PUBLICATIONS

"U.S. Appl. No. 12/970,114, Advisory Action dated Oct. 1, 2015", 3 pgs.

(Continued)

*Primary Examiner* — Marvin Payen
(74) *Attorney, Agent, or Firm* — Schwegman Lundberg & Woessner, P.A.

(57) ABSTRACT

Disclosed are embodiments of a lower integrated circuit (IC) package structure for a package-on-package (PoP) assembly. The lower IC package structure includes an interposer having pads to mate with terminals of an upper IC package. An encapsulant material is disposed in the lower IC package, and this encapsulant may be disposed proximate one or more IC die. An upper IC package may be coupled with the lower IC package to form a PoP assembly. Such a PoP assembly may be disposed on a mainboard or other circuit board, and may form part of a computing system. Other embodiments are described and claimed.

19 Claims, 9 Drawing Sheets

(51) Int. Cl.
  *H01L 23/13* (2006.01)
  *H01L 23/498* (2006.01)
  *H01L 23/00* (2006.01)
(52) U.S. Cl.
  CPC .......... *H01L 24/73* (2013.01); *H01L 25/0657* (2013.01); *H01L 2224/16225* (2013.01); *H01L 2224/32145* (2013.01); *H01L 2224/32225* (2013.01); *H01L 2224/48145* (2013.01); *H01L 2224/48227* (2013.01); *H01L 2224/73204* (2013.01); *H01L 2224/73265* (2013.01); *H01L 2225/06568* (2013.01); *H01L 2225/1023* (2013.01); *H01L 2225/1041* (2013.01); *H01L 2225/1058* (2013.01); *H01L 2924/09701* (2013.01); *H01L 2924/14* (2013.01); *H01L 2924/15311* (2013.01); *H01L 2924/15331* (2013.01); *H01L 2924/3025* (2013.01); *H01L 2924/3511* (2013.01)

(56) References Cited

U.S. PATENT DOCUMENTS

| | | |
|---|---|---|
| 2004/0212082 A1 | 10/2004 | Yang |
| 2007/0262473 A1 | 11/2007 | Yim et al. |
| 2008/0142996 A1 | 6/2008 | Subramanian et al. |
| 2008/0157350 A1 | 7/2008 | Cheah et al. |
| 2009/0166834 A1 | 7/2009 | Yoon et al. |
| 2009/0236718 A1 | 9/2009 | Yang et al. |
| 2009/0273094 A1 | 11/2009 | Ha et al. |
| 2010/0148344 A1 | 6/2010 | Chandra et al. |
| 2010/0237482 A1 | 9/2010 | Yang et al. |
| 2010/0301469 A1 | 12/2010 | Choi et al. |
| 2011/0210436 A1* | 9/2011 | Chow ................ H01L 21/563 257/686 |
| 2012/0159118 A1 | 6/2012 | Wong et al. |

FOREIGN PATENT DOCUMENTS

| | | |
|---|---|---|
| JP | 2008166527 A | 7/2008 |
| JP | 2009135398 A | 6/2009 |
| JP | 2010103517 A | 5/2010 |
| KR | 100792352 B1 | 1/2008 |
| KR | 1020080060167 A | 7/2008 |
| TW | 200601516 A | 1/2006 |
| TW | I278122 B | 4/2007 |
| TW | 200939451 A | 9/2009 |
| TW | 201230278 A | 7/2012 |
| WO | WO-2012082371 A1 | 6/2012 |

OTHER PUBLICATIONS

"U.S. Appl. No. 12/970,114, Advisory Action dated Nov. 30, 2017", 3 pgs.
"U.S. Appl. No. 12/970,114, Final Office Action dated Jun. 15, 2016", 17 pgs.
"U.S. Appl. No. 12/970,114, Final Office Action dated Jun. 19, 2015", 15 pgs.
"U.S. Appl. No. 12/970,114, Final Office Action dated Jul. 1, 2014", 7 pgs.
"U.S. Appl. No. 12/970,114, Final Office Action dated Jul. 3, 2017", 17 pgs.
"U.S. Appl. No. 12/970,114, Non Final Office Action dated Jan. 28, 2014", 9 pgs.
"U.S. Appl. No. 12/970,114, Non Final Office Action dated Feb. 2, 2016", 15 pgs.
"U.S. Appl. No. 12/970,114, Non Final Office Action dated Mar. 6, 2015", 14 pgs.
"U.S. Appl. No. 12/970,114, Non Final Office Action dated Oct. 24, 2014", 7 pgs.
"U.S. Appl. No. 12/970,114, Non Final Office Action dated Nov. 18, 2016", 17 pgs.
"U.S. Appl. No. 12/970,114, Response filed Jan. 26, 2015 to Non Final Office Action dated Oct. 24, 2014", 9 pgs.
"U.S. Appl. No. 12/970,114, Response filed Feb. 21, 2017 to Non Final Office Action dated Nov. 18, 2016", 9 pgs.
"U.S. Appl. No. 12/970,114, Response filed May 2, 2016 to Non Final Office Action dated Feb. 2, 2016", 10 pgs.
"U.S. Appl. No. 12/970,114, Response filed May 28, 2014 to Non Final Office Action dated Jan. 28, 2014", 9 pgs.
"U.S. Appl. No. 12/970,114, Response filed Jun. 8, 2015 to Non Final Office Action dated Mar. 6, 2015", 11 pgs.
"U.S. Appl. No. 12/970,114, Response filed Sep. 21, 2015 to Final Office Action dated Jun. 19, 2015", 10 pgs.
"U.S. Appl. No. 12/970,114, Response filed Oct. 1, 2014 to Final Office Action dated Jul. 1, 2014", 9 pgs.
"U.S. Appl. No. 12/970,114, Response filed Oct. 3, 2017 to Final Office Action dated Jul. 3, 2017", 10 pgs.
"U.S. Appl. No. 12/970,114, Response filed Oct. 17, 2016 to Final Office Action dated Jun. 15, 2016", 10 pgs.
"U.S. Appl. No. 12/970,114, Response filed Nov. 14, 2013 to Restriction Requirement dated Oct. 15, 2013", 10 pgs.
"U.S. Appl. No. 12/970,114, Restriction Requirement dated Oct. 15, 2013", 7 pgs.
"Chinese Application Serial No. 201180060795.X, Office Action dated Jan. 20, 2016"; W/ Machine Translation, 12 pgs.
"Chinese Application Serial No. 201180060795.X, Office Action dated May 6, 2015", W/ Machine Translation, 14 pgs.
"Chinese Application Serial No. 201180060795.X, Office Action dated May 17, 2016", W/ Machine Translation, 15 pgs.
"Chinese Application Serial No. 201180060795.X, Response filed Mar. 25, 2016 to Office Action dated Jan. 20, 2016", W/ English Claims, 9 pgs.
"Chinese Application Serial No. 201180060795.X, Response filed Aug. 1, 2016 to Office Action dated May 17, 2016", W/ English Translation of Claims, 9 pgs.
"Chinese Application Serial No. 201180060795.X, Response filed Sep. 21, 2015 to Office Action dated May 6, 2015", W/ English Claims, 9 pgs.
"International Application Serial No. PCT/US2011/062550, International Preliminary Report on Patentability dated Jun. 27, 2012", 7 pgs.
"International Application Serial No. PCT/US2011/062550, International Search Report dated May 31, 2012", 3 pgs.
"International Application Serial No. PCT/US2011/062550, Written Opinion dated May 31, 2012", 5 pgs.
"Korean Application Serial No. 10-2013-7015457, Office Action dated Oct. 15, 2014", W/ English Translation, 13 pgs.
"Korean Application Serial No. 10-2013-7015457, Response filed Dec. 15, 2014 to Office Action dated Oct. 15, 2014", W/ English Claims, 24 pgs.
"Korean Application Serial No. 2013-7015457, Office Action dated Mar. 25, 2015", W/ English Translation, 9 pgs.
"Korean Application Serial No. 2013-7015457, Response filed May 26, 2015 to Office Action dated Mar. 25, 2015", W/ English Claims, 18 pgs.
"Taiwan Application Serial No. 100145083, Office Action dated Aug. 17, 2015", W/ English Search Report, 17 pgs.
"Taiwanese Application Serial No. 100145083, Office Action dated Jun. 6, 2017", 8 pgs.
"Taiwanese Application Serial No. 100145083, Office Action dated Jul. 7, 2016", W/ English Translation, 27 pgs.
"Taiwanese Application Serial No. 100145083, Response filed Feb. 4, 2016 to Office Action dated Aug. 17, 2015", (English Translation of Claims), 34 pgs.
"Taiwanese Application Serial No. 100145083, Response filed Dec. 7, 2017 to Office Action dated Jun. 6, 2017", w/ English Translation, 80 pgs.
"Taiwanese Application Serial No. 100145083, Response filed Mar. 17, 2017 to Office Action dated Jul. 7, 2016", w/ English Translation, 85 pgs.

\* cited by examiner

LOWER IC PACKAGE STRUCTURE FOR COUPLING WITH AN UPPER IC PACKAGE TO FORM A PACKAGE-ON-PACKAGE (POP) ASSEMBLY AND POP ASSEMBLY INCLUDING SUCH A LOWER IC PACKAGE STRUCTURE

FIELD OF THE INVENTION

The disclosed embodiments relate generally to integrated circuit devices, and more particularly to stacking of integrated circuit packages.

BACKGROUND OF THE INVENTION

Integrated circuit (IC) devices having a small form factor may be useful in many types of computing systems, such as cell phones, smart phones, tablet computers, electronic reading devices, netbook computers, and laptop computers, as well as other hand-held or mobile computing systems. One solution to achieve a small form factor IC device is to use a package-on-package (PoP) architecture, which generally includes an upper IC package stacked over and electrically coupled with a lower IC package. The lower IC package may include one or more IC die—and perhaps one or more additional components—disposed on a first substrate or other die carrier. Similarly, the upper IC package may include one or more IC die (and perhaps one or more other components) disposed on a second substrate. In some circumstances, the lower IC package may be fabricated at one manufacturing facility and the upper IC package fabricated at another manufacturing facility, and then these two IC packages will need to be mechanically and electrically joined together. The lower IC package is electrically coupled to the upper IC package by one or more interconnects, and these interconnects may also provide a mechanical coupling between these two IC packages.

DETAILED DESCRIPTION OF THE INVENTION

Disclosed are embodiments of a lower integrated circuit (IC) package structure for a package-on-package (PoP) assembly. According to some embodiments, the lower IC package structure includes au interposer having pads to couple with mating terminals of an upper IC package. In further embodiments, an encapsulant material is disposed in the lower IC package, and this encapsulant may be disposed proximate one or more IC die. In some embodiments, an upper IC package can be coupled with the lower IC package to form a PoP assembly. In other embodiments, such a PoP assembly is disposed on a mainboard or other circuit board, and may form part of a computing system. Embodiments of a method of making the aforementioned lower IC package, as well as a PoP assembly, are also disclosed.

Figure 1A:
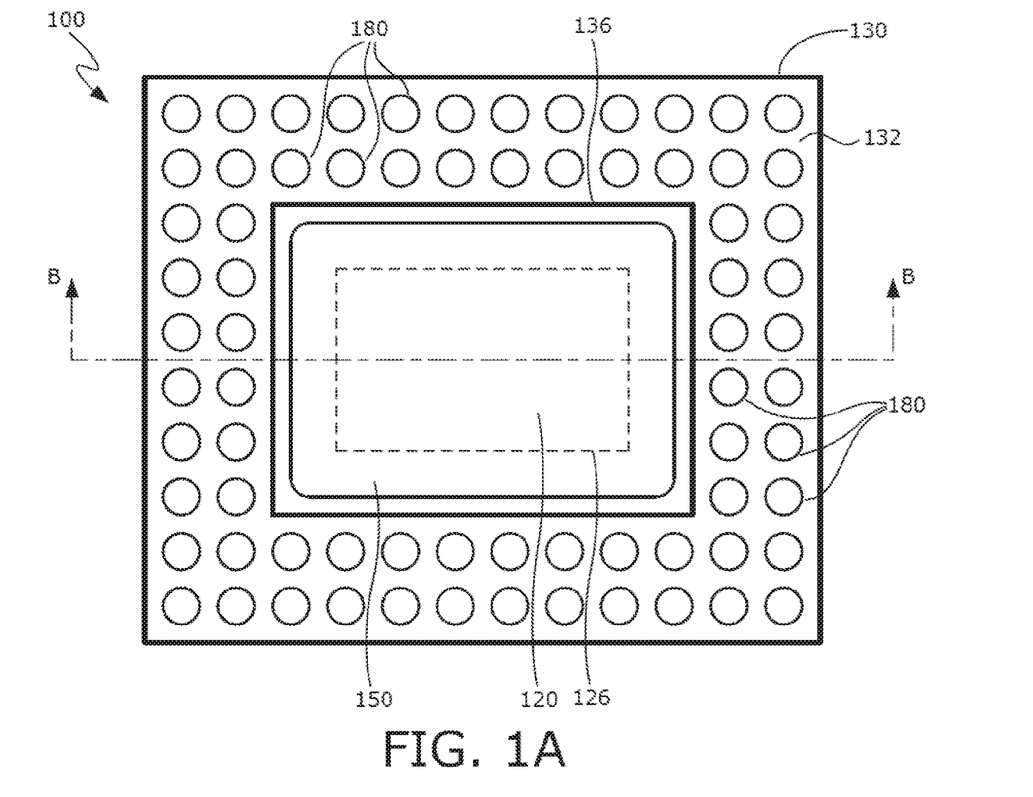
FIG. 1A is a schematic diagram illustrating a top view of an embodiment of a lower IC package structure.
Figure 1B:
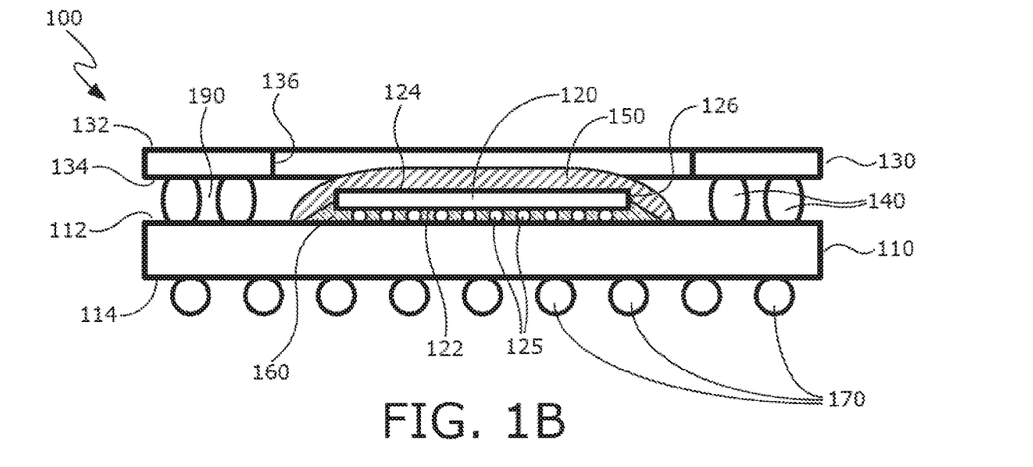
FIG. 1B is a schematic diagram illustrating a cross-sectional elevation view of the lower IC package of FIG. 1A, as taken along line B-B of FIG. 1A.

Turning now to FIGS. 1A and 1B, illustrated is an embodiment of a lower IC package 100. A top view of the lower IC package 100 is shown in FIG. 1A, whereas a cross-sectional elevation view, as taken along line B-B of FIG. 1A, is shown in FIG. 1B. The lower IC package 100 may be coupled with an upper IC package to form a PoP assembly, and an embodiment of such a PoP assembly will be described in greater detail below (see, e.g., FIG. 3, and the accompanying text).

With continued reference to FIGS. 1A and 1B, the lower IC package 100 includes a substrate 110 having a first side 112 and an opposing second side 114. An IC die 120 is disposed on the first side 112 of substrate 110 and is electrically coupled with the substrate by a number of interconnects 125. An interposer 130 is also disposed on the substrate's first side 112, and a number of interconnects 140 electrically couple (and perhaps mechanically attach) the interposer 130 to the underlying substrate 110. According to one embodiment, an encapsulant material 150 is disposed in the IC package 100, and the encapsulant 150 is positioned proximate the IC die 120. In one embodiment, a layer of an underfill material 160 may be disposed between the IC die 120 and substrate 110. Further, a plurality of electrically conductive terminals 170 (e.g., lands, solder bumps, metal columns or pillars, etc.) may be disposed on the second side 114 of substrate 110, and these terminals can be used to form electrical connections with a next-level component, such as a mainboard or other circuit board.

Substrate 110—sometimes referred to as a "package substrate"—may comprise any suitable type of substrate capable of providing electrical communications between the IC die 120 and a next-level component to which the IC package 100 is coupled (e.g., a circuit board). In another embodiment, the substrate 110 may comprise any suitable type of substrate capable of providing electrical communication between the IC die 120 and an upper IC package coupled with the lower IC package, and in a further embodiment the substrate 110 may comprise any suitable type of substrate capable of providing electrical communication between the upper IC package and a next-level component to which the IC package 100 is coupled. The substrate 110 may also provide structural support for the die 120. By way of example, in one embodiment, substrate 110 comprises a multi-layer substrate—including alternating layers of a dielectric material and metal—built-up around a core layer (either a dielectric or metal core). In another embodiment, the substrate 110 comprises a coreless multi-layer substrate. Other types of substrates and substrate materials may also find use with the disclosed embodiments (e.g., ceramics, sapphire, glass, etc.). Further, according to one embodiment, the substrate 110 may comprise alternating layers of dielectric material and metal that are built-up over the die 120 itself, this process sometimes referred to as a "bumpless build-up process." Where such an approach is utilized, the interconnects 125 may not be needed (as the build-up layers may be disposed directly over the die 120).

The IC die 120 may comprise any type of integrated circuit device. In one embodiment, the IC die 120 includes a processing system (either single core or multi-core). For example, the IC die may comprise a microprocessor, a graphics processor, a signal processor, a network processor, a chipset, etc. In one embodiment, the IC die 120 comprises a system-on-chip (SoC) having multiple functional units (e.g., one or more processing units, one or more graphics units, one or more communications units, one or more signal processing units, one or more security units, etc.). However, it should be understood that the disclosed embodiments are not limited to any particular type or class of IC devices.

The IC die 120 includes a front-side 122 and an opposing back-side 124. In some embodiments, the front-side 122 may be referred to as the "active surface" of the die. A number of interconnects 125 extend from the die's front-side 122 to the underlying substrate 110, and these interconnects 125 electrically coupled the die and substrate. Interconnects 125 may comprise any type of structure and materials capable of providing electrical communication between the die 120 and substrate 110. According to one embodiment, the interconnects 125 comprise an array of solder bumps extending between the die 120 and substrate 110 (perhaps in combination with an array of copper columns and/or copper pads disposed on the die 120 and/or substrate 110), and a solder reflow process may be utilized to form the interconnects 125. Of course, it should be understood that many other types of interconnects and materials are possible (e.g., wirebonds extending between the die 120 and substrate 110). In one embodiment, the interconnects 125 electrically coupled the die 120 to substrate 110, and the interconnects 125 also aid in mechanically securing the die to the substrate. In a further embodiment, a layer of underfill material 160 is disposed around interconnects 125 and between the IC die 120 and substrate 110, and this underfill layer 160 may also aid in mechanically securing the die 120 to substrate 110, as will be described below. Underfill material 160 may comprise any suitable material, such as a liquid or a pre-applied epoxy compound.

Interposer 130 has a first side 132 and an opposing second side 134, with the second side 134 facing the first side 112 of substrate 110. In one embodiment, as illustrated in FIGS. 1A-1B, the interposer 130 comprises a frame shape having an opening or window 136. Opening 136 may encompass a periphery 126 of IC die 120; however, in other embodiments the opening 136 and die periphery 126 may not be aligned and/or may not be concentric, and a portion of the die's periphery 126 may extend outside of the window 136.

Figure 1C:
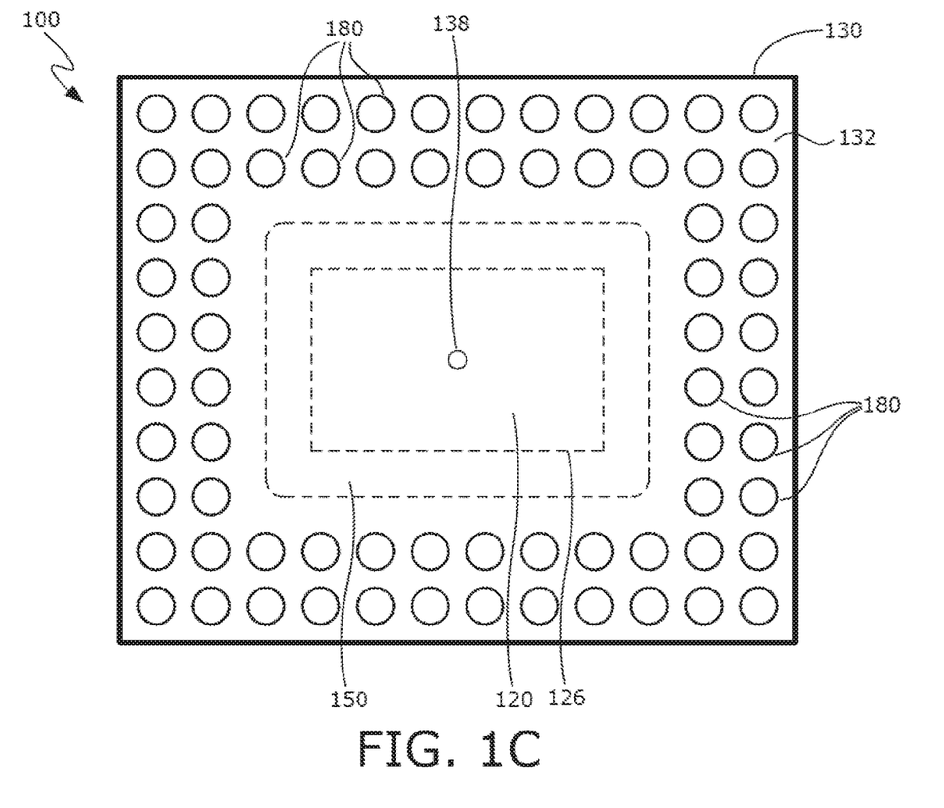
FIG. 1C is a schematic diagram illustrating a top view of another embodiment of a lower IC package structure.

It should be understood that the disclosed embodiments are not limited to a frame-shaped interposer and, further, that interposer 130 may have any suitable shape and configuration. For example, in another embodiment, as shown in FIG. 1C, the interposer 130 comprises a solid rectangular plate without an opening. According to one embodiment, the solid rectangular plate interposer 130 of FIG. 1C includes a small aperture 138 for insertion of the encapsulant 150.

Returning to FIGS. 1A and 1B, disposed on the first side 132 of interposer 130 is a plurality of electrically conductive terminals 180. Each of the electrically conductive terminals 180 may comprise any suitable structure and material capable of forming an electrical connection with a mating terminal of an upper IC package to be joined with the lower IC package 100. In one embodiment, each of the terminals 180 comprises a pad or land adapted to mate with a corresponding conductive bump extending from the upper IC package, and these mating structures may be joined by a solder reflow process. However, it should be understood that a terminal 180 may comprise any other type of structure (e.g., a column, bump, etc.). Further, in one embodiment, some of the terminals 180 may have a different size and/or structure compared to other terminals (e.g., terminals used for power delivery may be different than terminals used for signaling, etc.).

As noted above, a number of interconnects 140 extend between the interposer's second side 134 and the first side 112 of substrate 110, and these interconnects electrically couple the interposer 130—and, hence, an upper IC package coupled to the interposer—with substrate 110. Interconnects 140 may comprise any type of structure and materials capable of providing electrical communication between the interposer 130 and substrate 110. According to one embodiment, the interconnects 140 comprise an array of solder bumps extending between the interposer 130 and substrate 110 (perhaps in combination with an array of copper columns and/or copper pads disposed on the interposer 130 and/or substrate 110), and a solder reflow process may be utilized to form the interconnects 140. Of course, it should be understood that many other types of interconnects and materials are possible. In one embodiment, the interconnects 140 also aid in mechanically securing the interposer 130 to the substrate 110. In a further embodiment, as will be described in greater detail below, the encapsulant material 150 may extend into the gap 190 between the interposer 130 and substrate 110, and the encapsulant may extend around at least a portion of one or more of the interconnects 140. Thus, the encapsulant 150 may also aid in mechanically securing the interposer 130 to substrate 110.

As previously noted, an encapsulant 150 is disposed in the IC package 100. The encapsulant 150 may comprise any suitable material or combination of materials. In one embodiment, the encapsulant material comprises a liquid epoxy, and in a further embodiment the epoxy includes one or more filler materials to alter one or more characteristics of the epoxy (e.g., curing temperature, hardness, yield strength, modulus of elasticity, coefficient of thermal expansion, etc.). According to one embodiment, the encapsulant layer increases the stiffness of the lower IC package 100 and decreases the package's susceptibility to warpage. For example, during the assembly of lower IC package 100, as well as during joining with an upper IC package, the IC package 100 may be subjected to multiple high temperature cycles (e.g., during reflow, during epoxy cure, etc.), and this temperature cycling may cause warpage (e.g., due to differential thermal expansion between the die 120 and underlying substrate 110), and such warpage may lead to reduced reliability and/or structural failure. The increased stiffness provided by encapsulant 150 may alleviate the aforementioned warpage-induced failures.

Although referred to herein as an encapsulant, it should be understood that this element may be referred to by alternative terminology. For example, an encapsulant may be referred to as a mold, molding, overmold, or glob top.

The encapsulant 150 may be placed in the lower IC package 100 at any location or locations, as needed, to provide the desired mechanical characteristics for the package assembly. According to one embodiment, as shown in FIGS. 1A and 1B, the encapsulant 150 is disposed over at least a portion of the back-side 124 of IC die 120, and in some embodiments the encapsulant overlies substantially all of the die's back-side 124 (see FIG. 1B). In a further embodiment, as also shown in FIGS. 1A and 1B, the encapsulant 150 is disposed over at least a portion of the first side 112 of substrate 110. If an underfill material 160 is disposed between the IC die 120 and substrate 110, the encapsulant 150 may also contact portions of the underfill material (see FIG. 1B). In one embodiment, as shown in FIG. 1B, the encapsulant extends beyond the periphery 126 of die 120, but does not extend to regions on substrate 110 occupied by interconnects 140. According to one embodiment, as shown in FIG. 1B, the shape of encapsulant 150 is substantially flat above the back-side of die 124 but is rounded near the die's periphery. Also, in one embodiment, as shown in FIG. 1B, the encapsulant 150 does not extend above the front side 132 of interposer 130, although in the embodiment of FIG. 1B the encapsulant extends above the interposer's second side 134 and into the window 136.

It should be understood that FIGS. 1A and 1B illustrate a single exemplary embodiment of lower IC package 100 and encapsulant 150. However, many other configurations of encapsulant 150 and lower IC package 100 are possible. For example, in other embodiments, the encapsulant may not extend into the window 136 and may lie below the second side 134 of interposer 130. In a further embodiment, the encapsulant 150 may extend above the interposer's first side 132. Also, the encapsulant may have any other suitable shape and, further, in some embodiments the encapsulant may extend to regions of substrate 110 occupied by interconnects 140. Additional embodiments of the lower IC package 150 having alternative configurations of encapsulant 150, as well as additional features, are illustrated in FIGS. 1D through 1L.

Figure 1D:
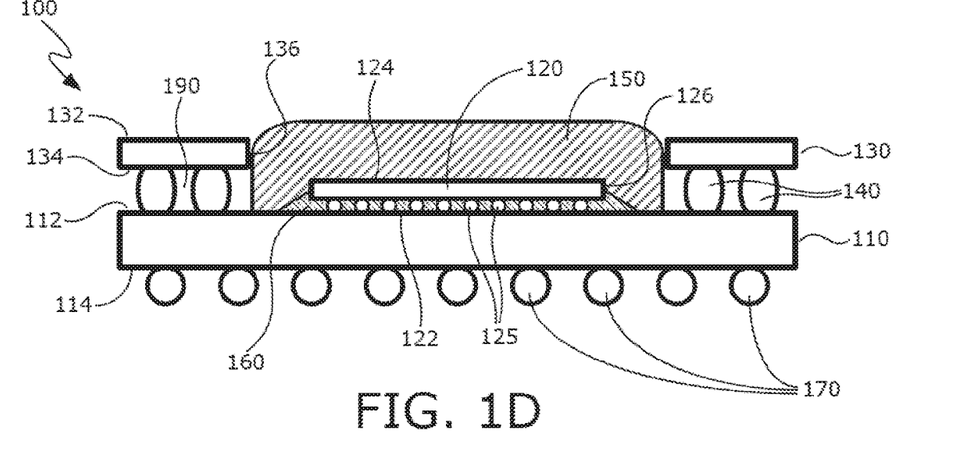
FIG. 1D is schematic diagram illustrating a cross-sectional elevation view of a further embodiment a lower IC package structure.
Figure 1E:
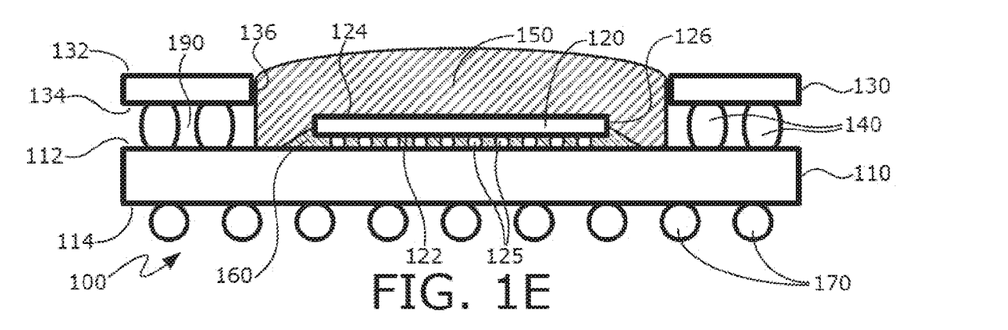
FIG. 1E is a schematic diagram illustrating a cross-sectional elevation view of another embodiment a lower IC package structure.
Figure 1F:
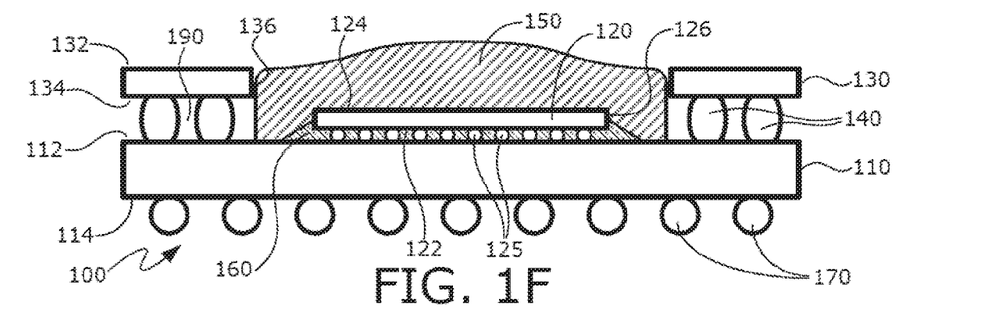
FIG. 1F is a schematic diagram illustrating a cross-sectional elevation view of another embodiment a lower IC package structure.

Referring first to FIG. 1D, in one embodiment, the encapsulant 150 extends above the first side 132 of interposer 130. Also, in the embodiment of FIG. 1D, the encapsulant has a rectangular cross-sectional profile with rounded corners. Referring to FIG. 1E, in one embodiment, encapsulant 150 has a shape in which the upper portion is substantially rounded. In a further embodiment, as shown in FIG. 1F, the encapsulant 150 has a shape that, when viewed in cross-section as shown, approximates a sine wave profile. In the embodiments of FIGS. 1D, 1E, and 1F, the encapsulant is disposed over substantially all of the die's back-side surface 124 and also contacts underfill material 160. Also, in the embodiments of FIGS. 1D through 1F, the encapsulant 150 does not extend to locations where interconnects 140 are disposed.

Figure 1G:
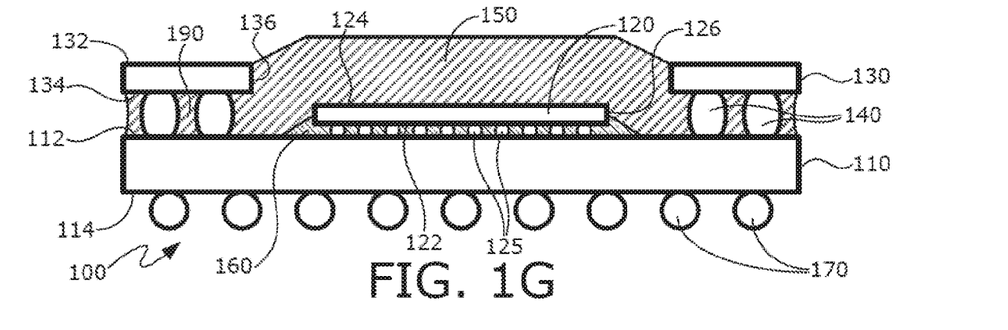
FIG. 1G is a schematic diagram illustrating a cross-sectional elevation view of another embodiment a lower IC package structure.

Turning now to FIG. 1G, in one embodiment, the encapsulant extends into the gap 190 between the interposer 130 and underlying substrate 110. Further, the encapsulant 150 extends into regions occupied by interconnects 140. In the embodiment of FIG. 1G, the encapsulant substantially surrounds one or more of the interconnects 140. In another embodiment, as also shown in FIG. 1G, the encapsulant fully fills the gap 190 and extends from the substrate's first surface 112 to the interposer's second surface 134. However, in other embodiments, the encapsulant may be disposed proximate the interconnects 140 and contact one or more of these interconnects, but may not fully fill the gap 190. Placing encapsulant 150 in the gap 190 between substrate 110 and interposer 130 and around one or more of the interconnects 140 may strengthen the mechanical attachment between the interposer 130 and substrate 110, as well as increasing the strength and reliability of the electrical interconnects 140. In the embodiment of FIG. 1G, an upper portion of the encapsulant 150 has a shape approximating a truncated pyramid (such a shape may be achieved by, for example, a molding process).

Figure 1H:
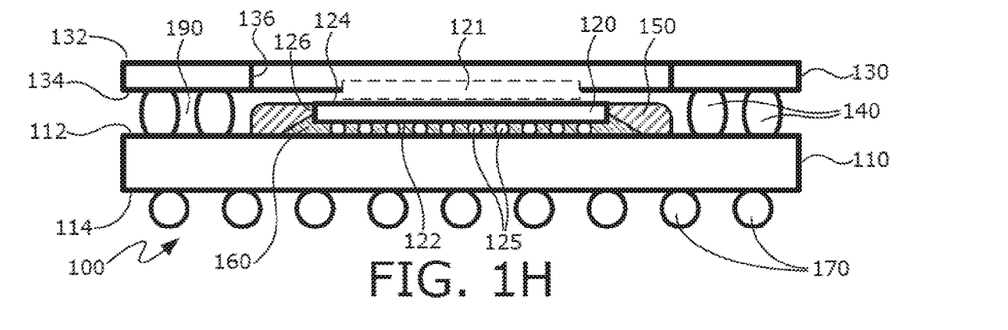
FIG. 1H is a schematic diagram illustrating a cross-sectional elevation view of another embodiment a lower IC package structure.
Figure 1I:
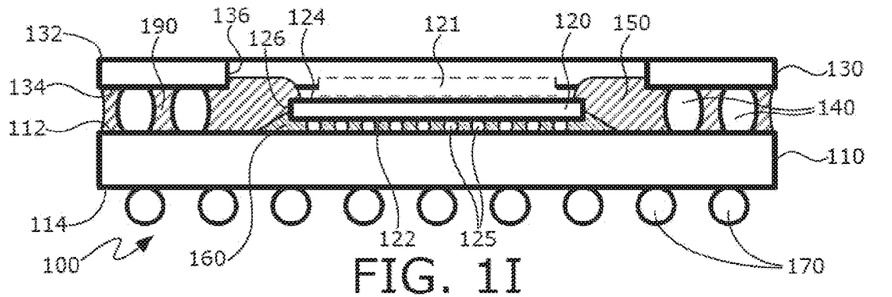
FIG. 1I is a schematic diagram illustrating a cross-sectional elevation view of another embodiment a lower IC package structure.

In the embodiments shown in FIGS. 1B through 1G, the encapsulant 150 was disposed over the back-side 124 of die 120. However, in other embodiments, the die's back-side 124 may be exposed. For example, as shown in FIG. 1H, the encapsulant 150 contacts the edges of the die's periphery 126, but the back-side 124 of the die 120 is substantially free of the encapsulant. By way of further example, as shown in FIG. 1I, the encapsulant 150 may extend into gap 190 and around one or more interconnects 140, but at least a portion of the die's back-side 124 remains substantially free of encapsulant. In the embodiment of FIG. 1I, the encapsulant may extend above the die back-side 124 and onto portions of this surface proximate the die periphery 126, while other portions of the die back-side 124 proximate the center of die 120 remain flee of encapsulant. In one embodiment, exposing at least a portion of the back-side 124 of die 120 may facilitate coupling of cooling solution—e.g., a layer of thermal interface material, a heat slug, heat spreader, etc. (not shown in figures)—with the die's back-side 124. In another embodiment, an exposed portion of die back-side 124 may facilitate stacking of one or more additional die on top of die 120, such as die 121 shown in dashed line in each of FIGS. 1H and 1I. Die 121 may be coupled with die 120 by any suitable interconnect structure (e.g., thru-silicon vias, or TSVs, wirebonds, etc.).

Figure 1J:
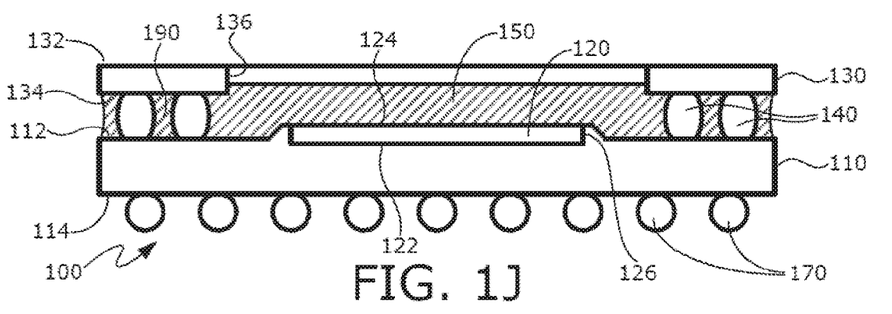
FIG. 1J is a schematic diagram illustrating a cross-sectional elevation view of another embodiment a lower IC package structure.

In the embodiments described thus far, die 120 was coupled with substrate 110 by a number of interconnects 125. However, in other embodiments, alternative structures and/or methods may be utilized to couple die 120 with substrate 110. For example, as shown in FIG. 1J, the dielectric and metal build-up layers that form substrate 110 may be built up directly over the die 120, in which case a dielectric and subsequent metal layer may be formed directly on the front-side 122 of die 120, with the metal layer forming electrical contact with one or more bond pads on the die. In such an embodiment, discrete interconnects 125 may not be necessary, as metallization in the substrate may directly contact a die bond pad. Examples of processes that may utilize the aforementioned technique include bumpless build-up layer (BBUL), die-embedding, and wafer-level packaging.

Figure 1K:
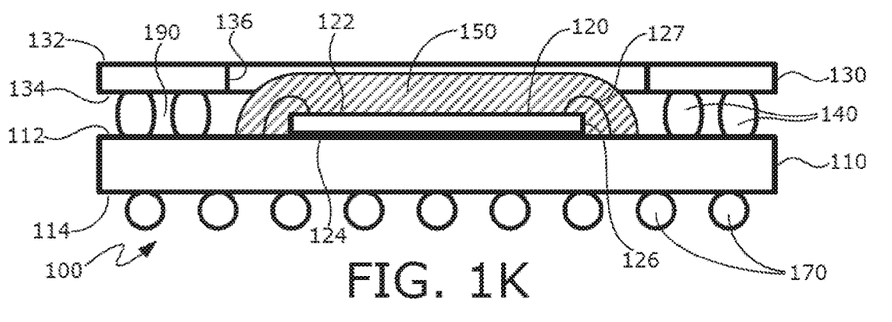
FIG. 1K is a schematic diagram illustrating a cross-sectional elevation view of another embodiment a lower IC package structure.

In yet another embodiment, wire bonding may be utilized to electrically couple the die 120 with substrate 110. With reference to FIG. 1K, the die 120 may be electrically coupled with substrate 110 by one or more bond wires 127, each bond wire extending between a bond pad on die front side 122 and a bond pad on substrate 110. Note that in the embodiment of FIG. 1K, the die 120 has been flipped over with the die back-side 124 located adjacent the first side 112 of substrate 110 and perhaps attached to substrate 110 by an adhesive (not shown in figures). In the embodiment of FIG. 1K, the encapsulant 150 extends over the front-side of die 122, as well as the die's periphery 126, and also over wirebonds 127. Also, in this embodiment, the encapsulant 150 has a shape that is substantially flat above die 120, but the encapsulant is rounded at the die's periphery 126 and over wirebonds 127.

Figure 1L:
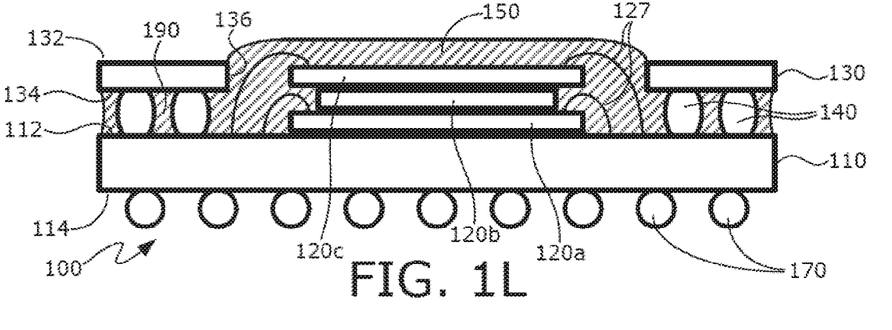
FIG. 1L is a schematic diagram illustrating a cross-sectional elevation view of another embodiment a lower IC package structure.

Turing to FIG. 1L, in another embodiment, two or more die may be disposed on substrate 110 in a stacked relationship, and wirebonds may be used to form electrical connections between each of these die and/or with substrate 110. By way of example, as shown in FIG. 1L, three die 120*a*, 120*b*, 120*c* may be arranged in a stack and disposed on the first side 112 of substrate 110. One or more wirebonds 127 may electrically couple each of the die 120*a*, 120*b*, 120*c* to any one or more of the other die and/or with substrate 110. In the embodiment of FIG. 1L, the encapsulant 150 extends through window 136 of interposer 130 and above the interposer's first surface 132. Further, the encapsulant extends into the gap 190 between the interposer 130 and substrate 110, as well as around one or more of the interconnects 140.

As described above, in some embodiments, the encapsulant 150 may not extend into regions of the lower IC package 100 where interconnects 140 are disposed. According to one embodiment, where it is desired to prevent flow of encapsulant into regions where interconnects 140 are located (or to any other region of the lower IC package 100), one or more flow barriers or other flow control devices or structures may be utilized to control the flow of encapsulant 150 within IC package 100. Any suitable flow barrier, or combination of barriers, may be utilized to control flow of encapsulant 150, such as dams, non-wetting coatings, and trenches, as well as any suitable combination of these and/or other features. Various exemplary embodiments of flow barriers are illustrated in FIGS. 2A through 2E.

Figure 2A:
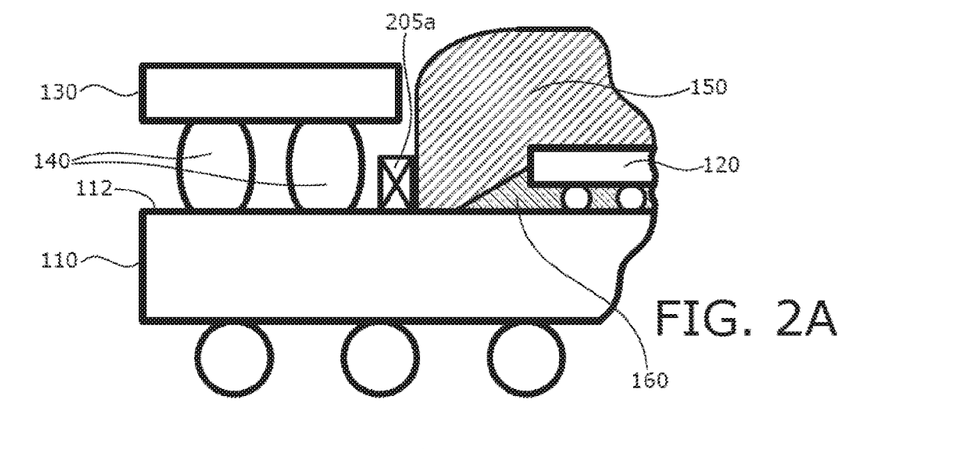
FIG. 2A is a schematic diagram illustrating a partial cross-sectional elevation view of an embodiment a lower IC package including a flow barrier.

Referring to FIG. 2A, in one embodiment, a dam 205*a* is disposed on the first surface 112 of substrate 110. The dam 205*a* may be disposed at any suitable location (or locations) in lower IC package 100, as desired, to inhibit the flow of encapsulant 150. In the embodiment of FIG. 2A, for example, the dam 205*a* is positioned between the periphery 126 of IC die 120 and the set of interconnects 140. Thus, the dam 205*a* inhibits the flow of encapsulant 150 into regions of IC package 100 occupied by interconnects 140. The dam 205 may be constructed from any suitable materials (e.g., metals, polymers, composites, etc.), and may be bonded to the substrate 110 by any suitable technique (e.g., by an adhesive, by reflowed solder, by diffusion bonding, etc.). In another embodiment, the dam 205*a* is coupled with the interposer 130 rather than substrate 110, and in a further embodiment the dam 205*a* is coupled with both the substrate 110 and interposer 130. According to another embodiment, the dam 205*a* is formed integral with the substrate 110 (or, alternatively, is formed integral with interposer 130).

Figure 2B:
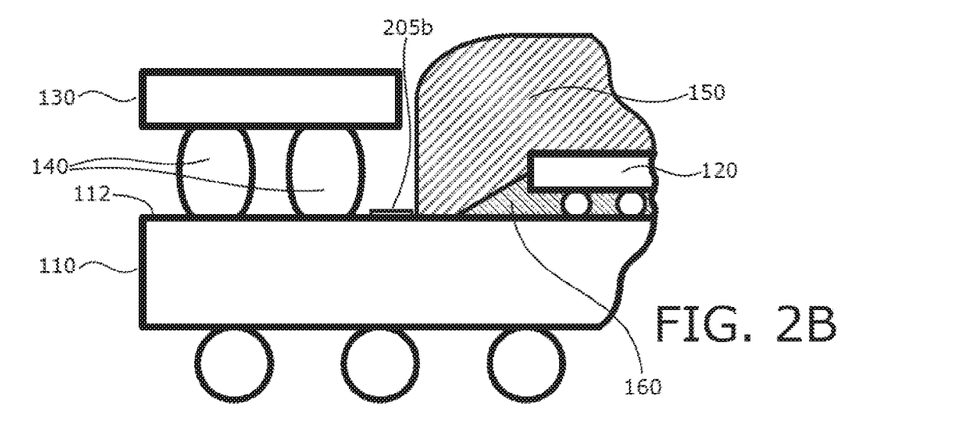
FIG. 2B is a schematic diagram illustrating a partial cross-sectional elevation view of another embodiment a lower IC package including a flow barrier.

Referring next to FIG. 2B, in another embodiment, a non-wetting coating or layer 205*b* is disposed on the substrate's first surface 112, wherein the non-wetting layer comprises a material that is non-wetting with respect to the encapsulant material 150. The non-wetting layer 205*b* may be disposed at any suitable location (or locations) in lower IC package 100, as desired to inhibit the flow of encapsulant 150. In one embodiment, the non-wetting layer 205*b* is positioned between the periphery 126 of IC die 120 and the array of interconnects 140 and, therefore, the non-wetting layer 205*b* inhibits the flow of encapsulant 150 into regions of IC package 100 occupied by interconnects 140. The non-wetting layer 205*b* may comprise any suitable material or combination of materials that is non-wetting with respect to the encapsulant material 150 (e.g., fluoropolymers, etc.), and may be disposed on the substrate 110 by any suitable technique (e.g., by spray-coating using a mask, by photolithography, by dispensing using a needle or syringe, etc.). In another embodiment, the non-wetting layer 205*b* is disposed on the interposer 130 rather than substrate 110, and in a further embodiment a non-wetting layer 205*b* is disposed on each of the substrate 110 and interposer 130.

Figure 2C:
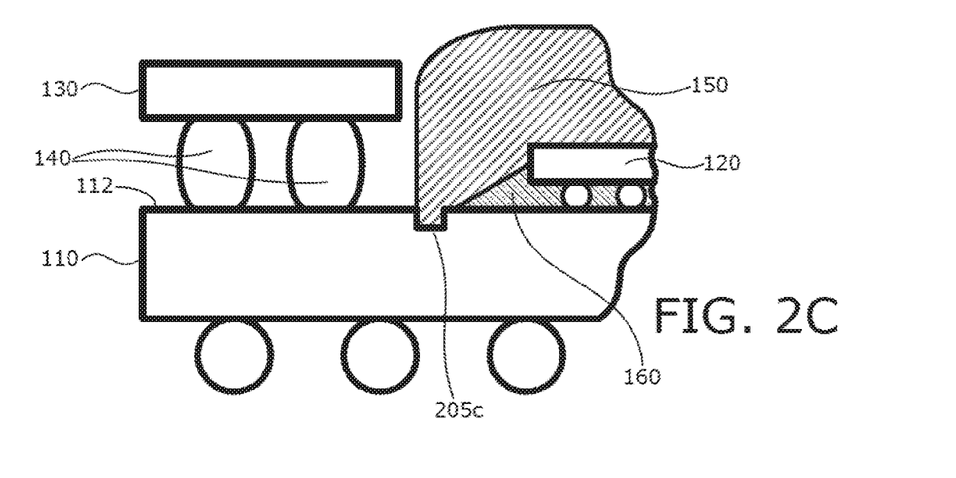
FIG. 2C is a schematic diagram illustrating a partial cross-sectional elevation view of a further embodiment a lower IC package including a flow barrier.

Turning to FIG. 2C, in a further embodiment, a trench 205*c* is disposed on the first surface 112 of substrate 110. The trench 205*c* may be disposed at any suitable location (or locations) in lower IC package 100, as desired to inhibit the flow of encapsulant 150. In the embodiment of FIG. 2C, for example, the trench 205*c* is positioned between the periphery 126 of IC die 120 and the set of interconnects 140 and, accordingly, the trench 205*c* inhibits the flow of encapsulant 150 into regions of IC package 100 occupied by the interconnects 140. The trench 205*c* may be formed using any suitable technique (e.g., by etching, by machining, by laser ablation, etc.). In another embodiment, a trench 205*c* is disposed on the interposer 130 rather than substrate 110, and in a further embodiment a trench 205*c* is formed on each of substrate 110 and interposer 130.

Figure 2D:
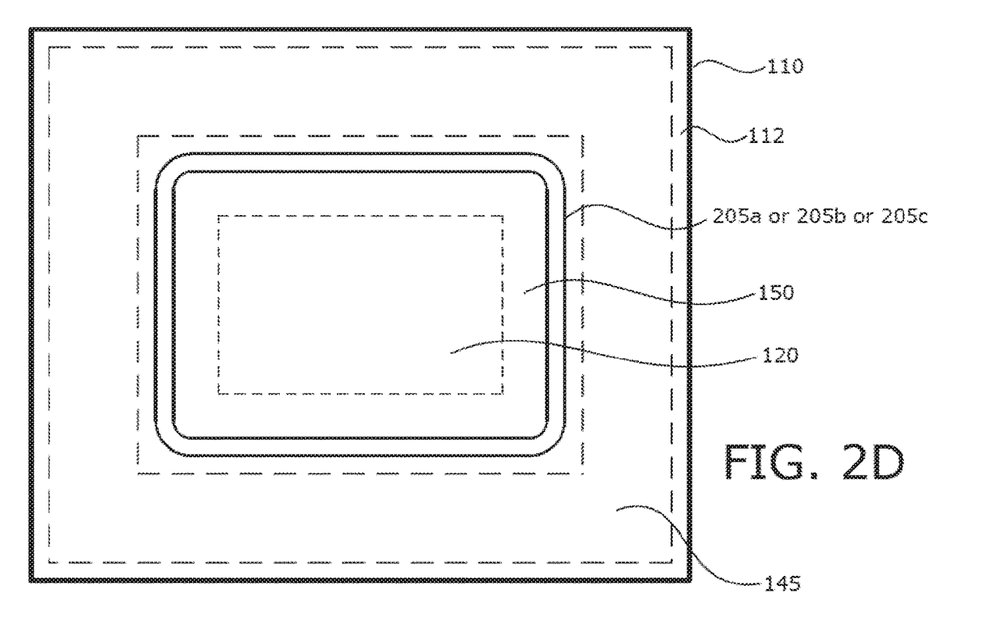
FIG. 2D is a schematic diagram illustrating a top view of yet another embodiment a lower IC package including a flow barrier.
Figure 2E:
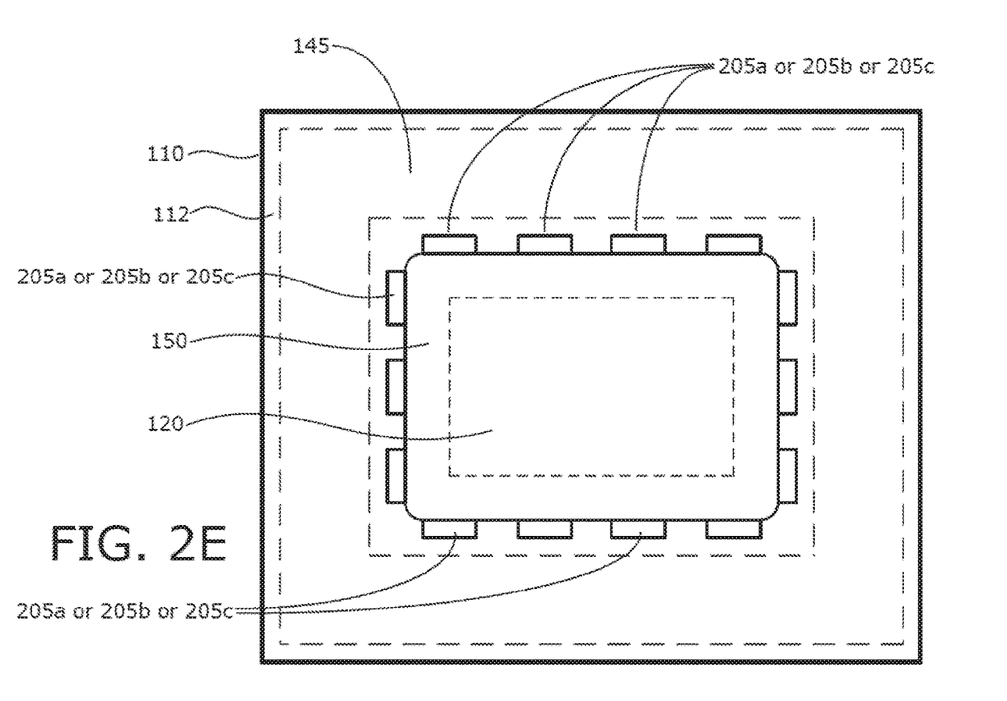
FIG. 2E is a schematic diagram illustrating a top view of yet a further embodiment a lower IC package including a flow barrier.

In one embodiment, a flow barrier or structure may extend around a periphery of the die 120 and through the region between the die 120 and interconnects 140. For example, in one embodiment, as shown in FIG. 2D, a barrier (e.g., 205*a*, or 205*b*, or 205*c*) is disposed on the first surface 112 of substrate 110, and is positioned on the substrate first surface 112 between the die 120 and a region 145 occupied by interconnects 140. According to one embodiment, the flow barrier (205*a*, or 205*b*, or 205*c*) extends entirely around the die's periphery 126; however, in other embodiments, a flow barrier may be discontinuous and one or more breaks or voids may exist in this structure. By way of example, in one embodiment, as shown in FIG. 2E, a flow barrier (e.g., 205*a*, or 205*b*, or 205*c*) may comprises a plurality of separate discrete elements that, together, inhibit the flow of encapsulant 150. In yet a further embodiment, a flow barrier may comprise a plurality of discrete elements disposed on the substrate 110 (or interposer 130), and these discrete elements may comprise passive electrical devices (e.g., a capacitor, resistor, inductor, or any combination of these and/or other devices).

Figure 3:
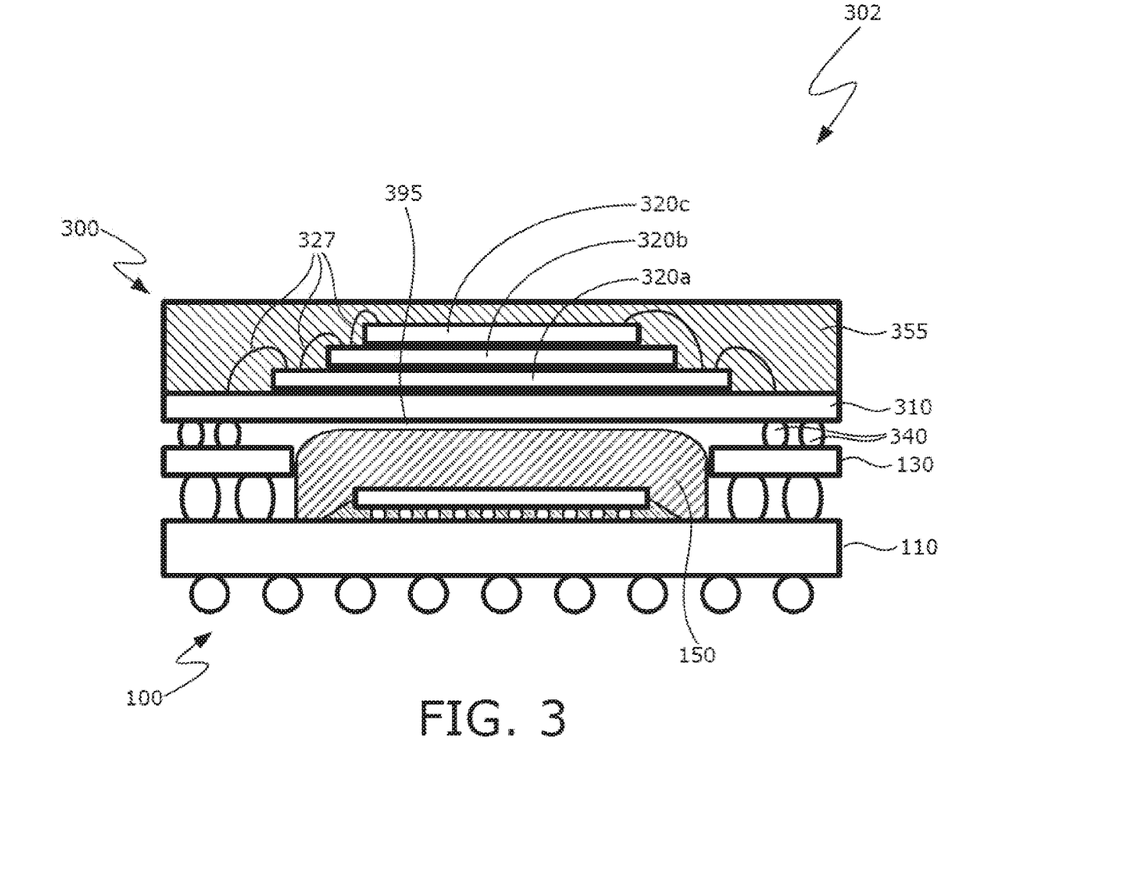
FIG. 3 is a schematic diagram illustrating a cross-sectional elevation view of an embodiment of a package-on-package (PoP) assembly.

Referring now to FIG. 3, illustrated is an embodiment of a package-on-package (PoP) assembly 302. The PoP assembly 302 includes a lower IC package 100 and an upper IC package 300. Lower IC package 100 may comprise any one of the embodiments of a lower IC package described herein. According to one embodiment, lower IC package 100 includes one or more processing systems and upper IC package 300 includes one or more memory devices. In another embodiment, lower IC package 100 includes one or more processing systems and upper IC package 300 comprises a wireless communications system (or, alternatively, includes one or more components of a communications system). In a further embodiment, lower IC package 100 includes one or more processing systems and upper IC package 300 includes a graphics processing system. The PoP assembly 302 may comprise part of any type of computing system, such as a hand-held computing system (e.g., a cell phone, smart phone, music player, etc.), mobile computing system (e.g., a laptop, nettop, tablet, etc.), a desktop computing system, or a server. In one embodiment, the PoP assembly comprises a solid state drive (SSD).

Upper IC package 300 may comprise any suitable package structure. In one embodiment, as shown in FIG. 3, the upper IC package 300 comprises a number of IC die 320*a*. 320*b*. 320*c* disposed on a package substrate 310. A number of wirebonds 327 electrically connect each of the die 320*a*, 320*b*, 320*c* with one or more of the other die and/or with substrate 310. A molding material 355 may be disposed over the die 320*a-c* and substrate 310. According to one embodiment, a plurality of interconnects 340 couple the upper IC package 300 to lower IC package 100. In one embodiment, the set of interconnects 340 are coupled with the set of terminals 180 on the interposer 130.

Each of the interconnects 340 may comprise any type of structure and materials capable of providing electrical communication between the upper and lower IC packages 100, 300. According to one embodiment, the set of interconnects 340 comprises an array of solder bumps extending between bond pads 180 on the interposer 130 of lower IC package 100 and the substrate 310 of upper IC package 300 (perhaps in combination with an array of columns and/or pads disposed on the substrate 310). A solder reflow process may be utilized to form the plurality interconnects 340. Of course, it should be understood that many other types of interconnects and materials are possible. In one embodiment, the array of interconnects 340 also aid in mechanically securing the upper IC package 300 to the lower IC package 100.

In one embodiment, as illustrated in FIG. 3, a gap 395 may exist between an upper surface of encapsulant 150 and a lower surface of substrate 310. In another embodiment, the substrate 310 may rest upon the encapsulant 150. Where the substrate 310 contacts the encapsulant 150, the encapsulant may be utilized to control the stand-off height between the interposer 130 and substrate 310 and, hence, to maintain a desired height of interconnects 340.

Figure 4:
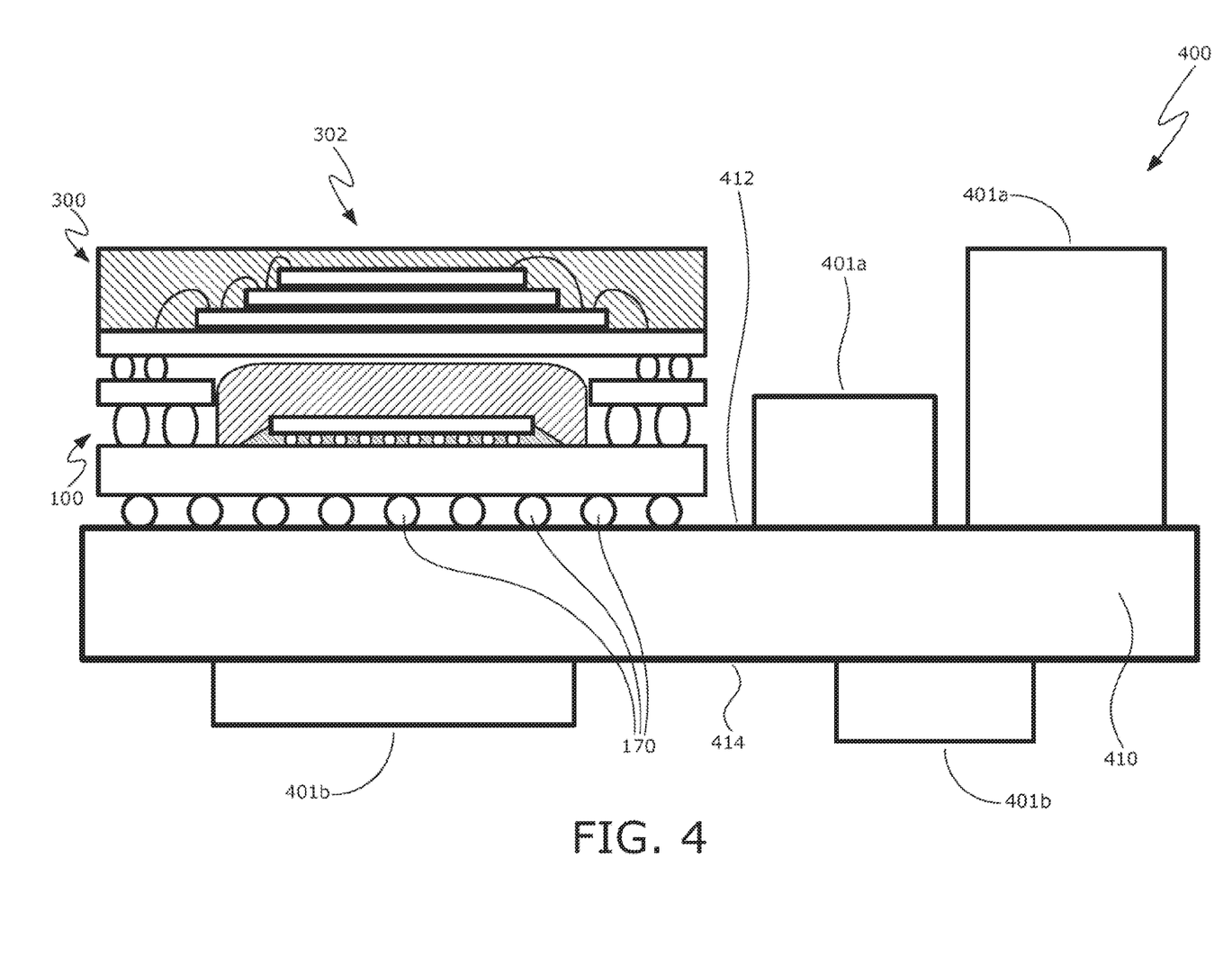
FIG. 4 is a schematic diagram illustrating a cross-sectional elevation view of an embodiment of a computing system including a PoP assembly.

Turning now to FIG. 4, illustrated is an embodiment of a computing system 400. The system 400 includes a number of components disposed on a mainboard 410 or other circuit board. Mainboard 410 includes a first side 412 and an opposing second side 414, and various components may be disposed on either one or both of the first and second sides 412, 414. In the illustrated embodiment, the computing system 400 includes a PoP assembly 302 disposed on the mainboard's first side 412, and PoP assembly 302 may comprise any of the embodiments described herein. System 400 may comprise any type of computing system, such as a hand-held computing device (e.g., a cell phone, a smart phone, a mobile internet device, a music player, etc.) or a mobile computing device (e.g., a laptop computer, a nettop computer, tablet computer, etc.). However, the disclosed embodiments are not limited to hand-held and other mobile computing devices and these embodiments may find application in other types of computing systems, such as desk-top computers and servers.

Mainboard 410 may comprise any suitable type of circuit board or other substrate capable of providing electrical communication between one or more of the various components disposed on the board. In one embodiment, for example, the mainboard 410 comprises a printed circuit board (PCB) comprising multiple metal layers separated from one another by a layer of dielectric material and interconnected by electrically conductive vias. Any one or more of the metal layers may be formed in a desired circuit pattern to route—perhaps in conjunction with other metal layers—electrical signals between the components coupled with the board 410. However, it should be understood that the disclosed embodiments are not limited to the above-described PCB and, further, that mainboard 410 may comprise any other suitable substrate.

As noted above, disposed on the first side 412 of mainboard 410 is a PoP assembly 302. The PoP assembly 302 may comprise an upper IC package 300 coupled with a lower IC package 100, as previously described. The PoP assembly 302 may include any desired combination of integrated circuit devices. In one embodiment, the PoP assembly 302 includes any one or more of a processing system, a graphics processing system, a signal processing system, a wireless communications system, a network processing system, a chipset, a memory, as well as combinations of these and/or other systems. In one embodiment, an IC die disposed in PoP assembly 302 comprises a system-on-chip (SoC). However, it should be understood that the disclosed embodiments are not limited to any particular type or class of IC devices. Also, it should be noted that, in some embodiments, other components may be disposed on the PoP assembly 302. Other components that may be disposed in PoP assembly 302 include, for example, a voltage regulator and passive electrical devices, such as capacitors, resistors, filters, inductors, etc.

The PoP assembly 302 is electrically connected with mainboard 410 by a plurality of terminals 170 (e.g., lands, solder bumps, metal columns or pillars, etc.) extending from the PoP assembly, which are coupled with corresponding terminals (e.g., bond pads, bumps, columns, pillars, etc.) on the substrate 410. Any suitable process may be utilized to form electrical connections between the set of terminals 170 of PoP assembly 302 and the corresponding set of terminals on substrate 410. For example, these mating terminals may be electrically coupled (and perhaps mechanically joined) by a solder reflow process.

In addition to PoP assembly 302, one or more additional components may be disposed on either one or both sides 412, 414 of the mainboard 410. By way of example, as shown in the figures, components 401*a* may be disposed on the first side 412 of the mainboard 110, and components 401*b* may be disposed on the mainboard's opposing side 414. Additional components that may be disposed on the mainboard 410 include other IC devices (e.g., processing devices, memory devices, signal processing devices, wireless communication devices, etc.), power delivery components (e.g., a voltage regulator, a power supply such as a battery, and/or passive devices such as a capacitor), and one or more user interface devices (e.g., an audio input device, an audio output device, a keypad or other data entry device such as a touch screen display, and/or a graphics display, etc.), as well as any combination of these and/or other devices. In another embodiment, the computing system 400 includes a radiation shield. In a further embodiment, the computing system 400 includes a cooling solution. In yet another embodiment, the computing system 400 includes an antenna. In yet a further embodiment, the assembly 400 may be disposed within a housing.

Figure 5:
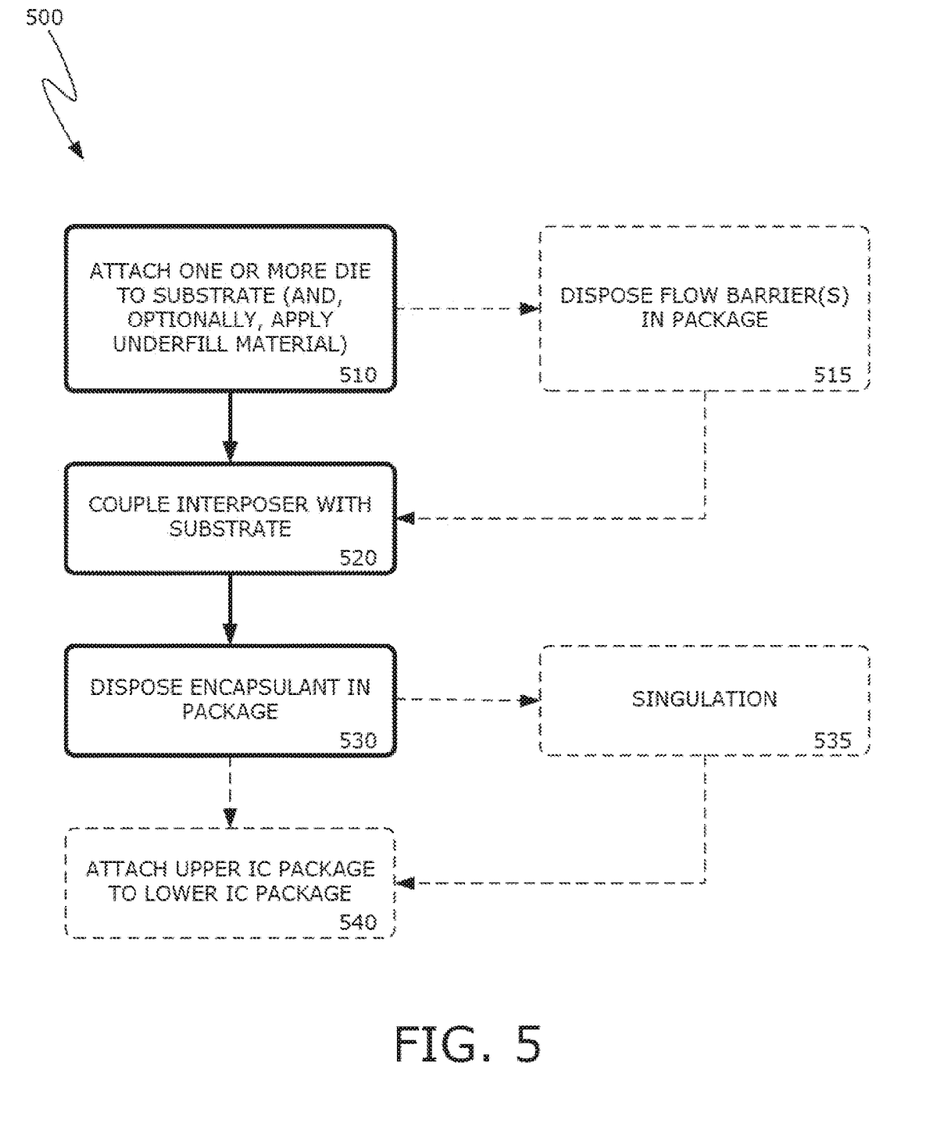
FIG. 5 is a block diagram illustrating embodiments of a method of making a lower IC package structure, as well as a package-on-package assembly.

Referring to FIG. 5, illustrated are embodiments of a method of making a lower IC package, as well as attaching the lower IC package to an upper IC package to form a PoP assembly. As set forth in block 510, one or more IC die are attached to a substrate, and in some embodiments an underfill material may be disposed between an IC die and the substrate (see, e.g., die 120—or 120*a-c*—and underfill 160 in any of the embodiments illustrated in FIGS. 1A through 1L, as well as the accompanying text above). As set forth in block 520, an interposer is coupled with the substrate (see, e.g., interposer 130 in any of the embodiments of FIGS. 1A through 1L). As set forth in block 530, an encapsulant is disposed in the lower IC package (see, e.g., encapsulant 150 in any of the embodiments of FIGS. 1A through 1L). The encapsulant 150 may be disposed in the IC package using any suitable technique, such as by a syringe or needle dispenser, by molding, by stencil printing, etc. In one embodiment, as set forth in block 515, one or more flow barriers are disposed in the lower IC package to control flow of encapsulant 150 (see. e.g., flow barriers 205*a-c* in any of the embodiments illustrated in FIGS. 2A through 2E, as well as the accompanying text above). According to one embodiment, the substrate and interposer are constructed as part of a panel or strip, and one or more of the aforementioned assembly processes may be performed at the panel level, in which case the discrete package assemblies are separated from one another by a singulation process, as set forth in block 535. In yet another embodiment, as set forth in block 540, an upper IC package is attached to the lower IC package to form a PoP assembly (see, e.g., FIG. 3 and the accompanying text above).

Numerous embodiments have been described with respect to FIGS. 1A through 1L. FIGS. 2A through 2E, FIG. 3. FIG. 4, and FIG. 5, and it should be understood that these embodiments, or certain features of an embodiment, may be used in any combination. For example, any of the flow barriers illustrated in FIGS. 2A through 2E may be utilized with any of the other embodiments described herein. By way of further example, any of the embodiments of a lower IC package illustrated in FIGS. 1A through 1L may form part of a PoP assembly (e.g., see FIG. 3) or a computing system (e.g., see FIG. 4). Also, terms such as "first side", "second side", "first surface", "second surface", and so on, are used herein to describe various features of the disclosed embodiments. However, it should be understood that any suitable nomenclature or terminology may be ascribed to the various features and embodiments disclosed herein (e.g., "upper side", "lower side", "upper surface", "lower surface", etc.).

The above-described embodiments may exhibit several noteworthy features. The combination of the interposer and encapsulant can reduce package warpage during temperature cycling (e.g., at reflow temperatures), and can also reduce package warpage of the final assembly (e.g., at room temperature). Simulation studies have suggested that the combination of the interposer and encapsulant can, in some embodiments, potentially reduce by over half the warpage that occurs during temperature cycling and, further, reduce by over half the warpage of the final assembly. In addition, the interposer may provide pads to mate with bumps (or other terminals) extending from the upper IC package, which eliminates a bump tip-to-bump tip interface that can occur where interconnects between the upper and lower IC packages comprise a bump-on-bump structure. Eliminating such bump tip-to-bump tip engagements during assembly can minimize misalignment between the upper and lower IC packages and, further, may reduce non-wet solder joint failures. Also, a solder bumping step is not needed on the interposer prior to attachment to the upper IC package (however, application of a solder paste layer to pads on the interposer is within the scope of the disclosed embodiments). Furthermore, in addition to providing increased package stiffness, the encapsulant can protect any IC die disposed in the lower IC package and reduce die cracking. In some embodiments, a thin die (e.g., a die having a thickness of 250 micrometers, or less) may be disposed in the lower IC package, and the encapsulant can protect such a thin die.

The foregoing detailed description and accompanying drawings are only illustrative and not restrictive. The figures may not show the actual size and/or scale of features that are represented. The figures have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

What is claimed is:

1. A lower integrated circuit (IC) package for a package-on-package (POP) assembly, the lower IC package comprising:
   a substrate and an IC die coupled with the substrate;
   an interposer having a lower side and an opposing upper side, the interposer including a frame having an opening, and;
   an encapsulant, the encapsulant disposed over at least a portion of a surface of the IC die, and over at least a portion of the substrate, the encapsulant protruding at least partially through the opening past the upper side of the interposer to a level adapted to contact an upper IC package when the upper IC package is attached to the interposer;
   a number of interconnects electrically coupling the interposer with the substrate; and
   a plurality of terminals disposed on the upper side of the interposer, the plurality of terminals for forming electrical connections with an upper IC package.

2. The lower integrated circuit (IC) package of claim 1, wherein die is coupled to the substrate using a bumpless build up connection.

3. The lower integrated circuit (IC) package of claim 1, wherein the IC die is coupled to the substrate using a ball grid and an underfill between the IC die and the substrate.

4. The lower integrated circuit (IC) package of claim 1, wherein the IC die is coupled to the substrate using one or more wirebonds.

5. The lower integrated circuit (IC) package of claim 1, wherein the substrate includes a core layer.

6. The lower integrated circuit (IC) package of claim 1, wherein the encapsulant includes one or more filler materials.

7. The lower integrated circuit (IC) package of claim 1, wherein the encapsulant has a rounded profile that protrudes through the opening.

8. The lower integrated circuit (IC) package of claim 1, wherein the encapsulant has a sine wave profile that protrudes through the opening.

9. A package-on-package (PoP) assembly comprising:
a lower integrated circuit (IC) package including a substrate and a lower IC die coupled with the substrate;
an interposer having a lower side and an opposing upper side, the interposer including a frame having an opening;
a number of interconnects electrically coupling the interposer with the substrate;
an encapsulant disposed over at least a portion of a surface of the lower IC die, the encapsulant protruding at least partially through the opening past the upper side of the interposer;
an upper IC package coupled above the encapsulant and contacting the encapsulant; and
a plurality of interconnects electrically coupling the upper IC package with the upper side of the interposer.

10. The package-on-package (PoP) assembly of claim 9, wherein the lower IC die includes a processor, and upper IC package includes one or more memory dies.

11. The package-on-package (PoP) assembly of claim 9, wherein the lower IC die is coupled to the substrate using a bumpless build up connection.

12. The package-on-package (PoP) assembly of claim 9, wherein the lower IC die is coupled to the substrate using a ball grid and an underfill between the IC die and the substrate.

13. The package-on-package (PoP) assembly of claim 9, wherein the encapsulant includes one or more filler materials.

14. The package-on-package (PoP) assembly of claim 9, wherein the encapsulant has a rounded profile that protrudes through the opening.

15. The package-on-package (PoP) assembly of claim 9, wherein the encapsulant has a sine wave profile that protrudes through the opening.

16. A lower integrated circuit (IC) package for a package-on-package (POP) assembly, the lower IC package comprising:
a substrate and an IC die coupled with the substrate with one or more wire bonds;
an interposer having a lower side and an opposing upper side, the interposer including a frame having an opening, and;
an encapsulant, the encapsulant disposed over at least a portion of a surface of the IC die, and over at least a portion of the substrate, the encapsulant and one or more of the wire bonds protruding at least partially through the opening past the upper side of the interposer to a level adapted to contact an upper IC package when the upper IC package is attached to the interposer;
a number of interconnects electrically coupling the interposer with the substrate; and
a plurality of terminals disposed on the upper side of the interposer, the plurality of terminals for forming electrical connections with an upper IC package.

17. The lower integrated circuit (IC) package of claim 16, wherein the encapsulant includes one or more filler materials.

18. The lower integrated circuit (IC) package of claim 16, wherein the encapsulant, has a rounded profile that protrudes through the opening.

19. The lower integrated circuit (IC) package of claim 16, wherein the encapsulant has a sine wave profile that protrudes through the opening.

* * * * *

UNITED STATES PATENT AND TRADEMARK OFFICE
CERTIFICATE OF CORRECTION

| | | |
|---|---|---|
| PATENT NO. | : 10,879,219 B2 | Page 1 of 1 |
| APPLICATION NO. | : 15/861421 | |
| DATED | : December 29, 2020 | |
| INVENTOR(S) | : Wong et al. | |

It is certified that error appears in the above-identified patent and that said Letters Patent is hereby corrected as shown below:

In the Claims

In Column 12, Line 49, in Claim 2, after "wherein", insert --the IC--

In Column 14, Line 28, in Claim 18, delete "encapsulant," and insert --encapsulant-- therefor Signed and Sealed this
Thirtieth Day of March, 2021

Drew Hirshfeld
*Performing the Functions and Duties of the*
*Under Secretary of Commerce for Intellectual Property and*
*Director of the United States Patent and Trademark Office*